(12) United States Patent
Taguchi et al.

(10) Patent No.: US 9,157,932 B2
(45) Date of Patent: Oct. 13, 2015

(54) WIRING BOARD AND PROBE CARD USING THE SAME

(71) Applicant: KYOCERA Circuit Solutions, Inc., Kyoto (JP)

(72) Inventors: Takayuki Taguchi, Hikone (JP); Kenji Terada, Moriyama (JP)

(73) Assignee: KYOCERA Circuit Solutions, Inc., Kyoto (JP)

( * ) Notice: Subject to any disclaimer, the term of this patent is extended or adjusted under 35 U.S.C. 154(b) by 226 days.

(21) Appl. No.: 13/728,877

(22) Filed: Dec. 27, 2012

(65) Prior Publication Data

US 2013/0169305 A1    Jul. 4, 2013

(30) Foreign Application Priority Data

Dec. 28, 2011 (JP) ................. 2011-289308

(51) Int. Cl.
*G01R 1/073* (2006.01)
*H05K 1/03* (2006.01)
*H05K 1/02* (2006.01)
*H05K 3/00* (2006.01)
*H05K 3/46* (2006.01)
*G01R 3/00* (2006.01)

(52) U.S. Cl.
CPC .......... *G01R 1/07307* (2013.01); *H05K 1/0271* (2013.01); *H05K 1/03* (2013.01); *H05K 3/4673* (2013.01); *G01R 1/07378* (2013.01); *G01R 3/00* (2013.01); *H05K 3/0058* (2013.01); *H05K 3/4602* (2013.01); *H05K 2201/0129* (2013.01); *H05K 2201/0187* (2013.01); *H05K 2201/0195* (2013.01); *H05K 2201/10409* (2013.01)

(58) Field of Classification Search
USPC ................................. 324/756.03
See application file for complete search history.

(56) References Cited

U.S. PATENT DOCUMENTS

| | | | | |
|---|---|---|---|---|
| 2008/0297184 A1* | 12/2008 | Miura et al. | ........ | 324/754 |
| 2010/0243299 A1* | 9/2010 | Kariya et al. | ........ | 174/255 |
| 2011/0083883 A1* | 4/2011 | Yugawa | ........ | 174/256 |
| 2012/0149218 A1* | 6/2012 | Itoh et al. | ........ | 439/78 |
| 2013/0153279 A1* | 6/2013 | Hayashi | ........ | 174/260 |

FOREIGN PATENT DOCUMENTS

| | | | |
|---|---|---|---|
| JP | H8-335752 | A | 12/1996 |
| JP | 2005-235997 | A | 9/2005 |
| JP | 2006-162422 | A | 6/2006 |
| JP | 2010-156594 | A | 7/2010 |

OTHER PUBLICATIONS

Mori, JP2006-162422, Machine Translation JPO, p. 1-21.*
Hayashi, JP2010-193188, Machine Translation JPO, p. 1-31.*
Office Action dated Apr. 20, 2015 issued in counterpart Japanese Application 2011-289308.

* cited by examiner

*Primary Examiner* — Thomas F Valone
(74) *Attorney, Agent, or Firm* — Procopio, Cory, Hargreaves & Savitch LLP

(57) ABSTRACT

A wiring board 3 according to the present invention includes a first resin layer 18*a* formed of a thermoplastic resin; a conductive layer 16 formed partially on the first resin layer 18*a*; a through hole P for insertion of a screw formed in a region where the conductive layer 16 is not formed and penetrating through the first resin layer 18*a* in a thickness direction thereof; and a dummy via hole D formed in a region between the through hole P and the conductive layer 16 and penetrating through the first resin layer 18*a*.

10 Claims, 8 Drawing Sheets

WIRING BOARD AND PROBE CARD USING THE SAME

CROSS REFERENCE TO RELATED APPLICATION

This application claims priority under 35 U.S.C. Section 119 to Japanese Patent Application No. 2011-289308, filed on Dec. 28, 2011. The disclosure of the above application is incorporated herein by reference in its entirety.

BACKGROUND OF THE INVENTION

1. Field of the Invention

The present invention relates to a wiring board and a probe card using the same which are used in a semiconductor wafer inspection apparatus or the like.

2. Description of Related Art

Conventionally, in a semiconductor wafer inspection apparatus, a probe card is used for inspecting electrical reliability of a semiconductor wafer.

For such a probe card, for example, Japanese Unexamined Patent Publication No. 2006-162422 discloses a configuration including a main board provided with an electrode for connection to a measuring instrument, a space transformer provided with a probe that makes contact with an electrode of an object to be measured, a sub board provided between the main board and the space transformer, and a reinforcing plate that reinforces the main board. A wiring board including an insulating layer and a conductive layer is used as the sub board of this probe card.

Incidentally, when the sub board is fixed to a main board with a screw, a stress may be applied to the insulating layer when the screw is used. As a result, the stress is applied to the conductive layer through the insulating layer, which tends to cause wire breakage in the conductive layer and eventually cause a reduction in the electrical reliability of the main board.

SUMMARY OF THE INVENTION

An object of the present invention is to provide a wiring board and a probe card using the same with improved electrical reliability.

A wiring board according to one aspect of the present invention includes a first resin layer formed of a thermoplastic resin; a conductive layer formed partially on the first resin layer; a through hole for insertion of a screw formed in a region where the conductive layer is not formed and penetrating through the first resin layer in a thickness direction thereof; and a dummy via hole formed in a region between the through hole and the conductive layer and penetrating through the first resin layer.

A wiring board according to another aspect of the present invention includes a core substrate, and an insulating layer formed on one principal surface of the core substrate, in which the insulating layer includes a first resin layer formed of a thermoplastic resin; a conductive layer formed partially on the first resin layer; a through hole for insertion of a screw formed in a region where the conductive layer is not formed and penetrating through the first resin layer in a thickness direction thereof; and a dummy via hole formed in a region between the through hole and the conductive layer and penetrating through the first resin layer.

Further, a probe card according to one aspect of the present invention includes the wiring board; a probe head connected to one principal surface of the wiring board and including a probe; a main board connected to other principal surface of the wiring board and including a screw hole formed therein; and a screw connecting the wiring board and the main board to each other, in which a screw head of the screw makes contact with the one principal surface of the wiring board, and a threaded shaft of the screw is inserted into both the through hole and the screw hole.

According to the wiring board of the present invention, since the dummy via hole penetrating through the first resin layer is provided in a region between the through hole for insertion of screw and the conductive layer, it is possible to reduce stress that is transmitted from the through hole for insertion of screw to the conductive layer through the first resin layer. As a result, it is possible to reduce the occurrence of wire breakage of the conductive layer, and eventually provide the wiring board having excellent electrical reliability.

Furthermore, according to the probe card of the present invention, it is possible to provide a probe card having excellent electrical reliability by using the wiring board.

DESCRIPTION OF THE PREFERRED EMBODIMENTS

Hereinafter, a probe card using a wiring board according to one embodiment of the present invention will be described in detail with reference to the drawings.

Figure 1A:
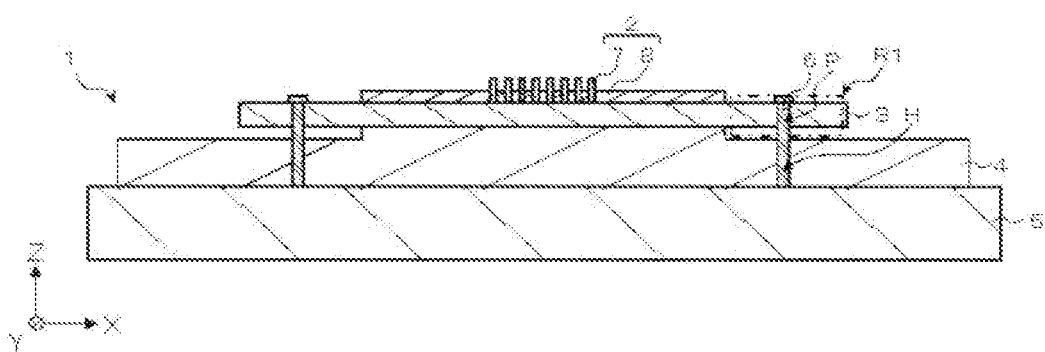
FIG. 1A is a cross sectional view taken along a thickness direction of a probe card according to an embodiment of the present invention.

A probe card 1 illustrated in FIG. 1A is used to inspect electrical reliability of a semiconductor wafer by means of a signal from a measuring instrument (not illustrated) such as a tester in a semiconductor wafer inspection apparatus. This probe card 1 includes a probe head 2, a wiring board 3 to which the probe head 2 is connected, a main board 4 to which the wiring board 3 is connected, a reinforcing plate 5 to which the main board 4 is connected, and a screw 6 for connecting the wiring board 3 and the main board 4 together.

The probe head 2 is used to inspect a semiconductor wafer. The probe head 2 includes a probe 7 and a holding member 8 that holds the probe 7. The probe 7 functions as a terminal to make contact with the semiconductor wafer, transmits a signal from the wiring board 3 to the semiconductor wafer, and transmits a signal from the semiconductor wafer to the wiring board 3. The probe 7 is arranged in accordance with a wiring pattern of the semiconductor wafer to be inspected, and the probe 7 which is compatible with the semiconductor wafer to be inspected is arbitrarily used. Further, the probe 7 penetrates through the holding member 8 in a thickness direction thereof and is electrically connected to the wiring board 3 in this embodiment.

The wiring board 3 functions as a holding member for the probe head 2 and electrically connects the probe 7 and the main board 4 to each other. Wiring in a pattern according to an arrangement of the probe 7 and a wiring pattern of the main board 4 is formed inside the wiring board 3, and the wiring board 3 which is compatible with the probe head 2 to be used is arbitrarily used. Further, the wiring board 3 is fixed to the main board 4 with a screw so that it can be arbitrarily changed according to the semiconductor wafer to be inspected.

Figure 1B:
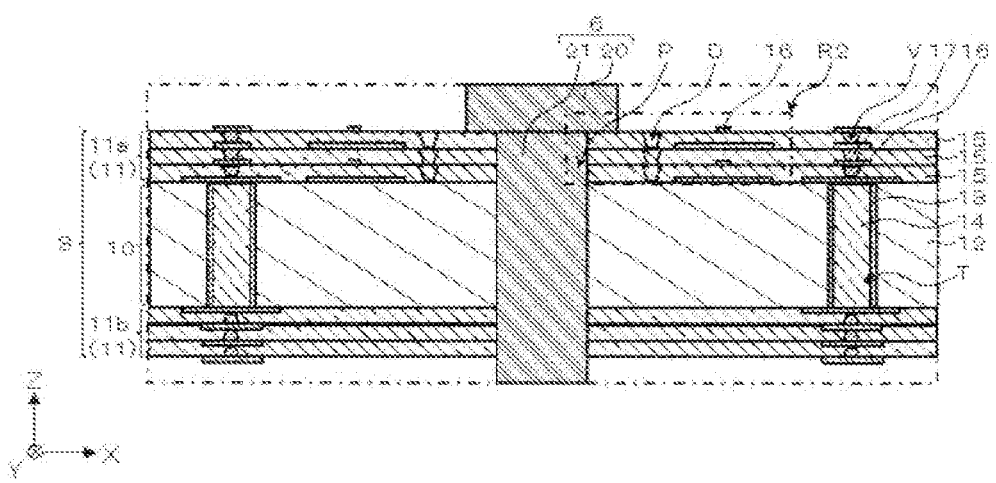
FIG. 1B is an enlarged cross sectional view of a portion R1 in FIG. 1A.

As illustrated in FIG. 1B, the wiring board 3 in this embodiment includes a core substrate 10 and a pair of buildup portions 11 formed on two principal surfaces of the core substrate 10. In addition, a through hole P penetrating through the wiring board 3 in a thickness direction thereof is formed.

For convenience sake, between the pair of buildup portions 11, the buildup portion 11 arranged on a side of the probe head 2 is named as a first buildup portion 11a, and the buildup portion 11 arranged on a side of the main board 4 is named as a second buildup portion 11b.

The wiring board 3 illustrated in FIG. 1B includes the pair of buildup portions 11 (first buildup portion 11a and second buildup portion 11b). However, the wiring board according to the present invention may include at least the first buildup portion 11a. Additionally, according to the wiring board 3 illustrated in FIG. 1B, the buildup portion 11 is formed of a plurality of insulating layers 15 that are stacked together. However, the buildup portion 11 may be formed of a single layer of the insulating layer 15.

The core substrate 10 increases the strength of the wiring board 3, and includes a substrate 12 with a through hole T formed therein with a cylindrical shape and penetrating through the substrate 12 in a thickness direction thereof, a through hole conductor 13 with a cylindrical shape formed on an inner wall of the through hole T, and an insulator 14 with a columnar shape arranged inside the through hole conductor 13.

The substrate 12 serves as a principal portion of the core substrate 10 and increases stiffness thereof. The substrate 12 includes a resin such as epoxy resin, a base material such as glass cloth covered with the resin, and an inorganic insulation filler such as a silica filler formed of a plurality of particles dispersed in the resin. The thickness of the substrate 12 is set to, for example, 0.1 mm or larger and 1 mm or smaller. A coefficient of thermal expansion of the substrate 12 in a planar direction thereof is set, for example, to 5 ppm/° C. or larger and 30 ppm/° C. or smaller. A coefficient of thermal expansion of the substrate 12 in a thickness direction thereof is set, for example, to 15 ppm/° C. or larger and 50 ppm/° C. or smaller. Young's modulus of the substrate 12 is set, for example, to 5 GPa or larger and 30 GPa or smaller.

The coefficient of thermal expansion of the substrate 12 is measured according to the measurement method complying with JISK7197-1991 using a commercially available TMA apparatus. The Young's modulus of the substrate 12 is measured with a Nano Indenter XP/DCM produced by MTS Systems Corporation. Hereinafter, the coefficient of thermal expansion and the Young's modulus of each member are measured in a similar manner as in the case of the substrate 12.

The through hole conductor 13 electrically connects the buildup portions 11 formed on the two principal surfaces of the core substrate 10 to each other. The through hole conductor 13 may be formed of a conductive material such as copper, titanium, molybdenum, chrome, or a nickel-chrome alloy.

The through hole conductor 13 is adhered to an inner wall of the through hole T having a cylindrical shape and penetrating through the substrate 12 in a thickness direction thereof. The diameter of the through hole T is set, for example, to 50 µm or larger and 250 µm or smaller.

The insulator 14 serves as a support surface of a via conductor 17 which is described later, and may be formed of a resin material such as epoxy resin.

In addition, the pair of buildup portions 11 are formed on the two principal surfaces of the core substrate 10, respectively, as described above. As illustrated in FIG. 1B, the buildup portion 11 includes a plurality of insulating layers 15 through which via holes V and dummy via holes D penetrate in a thickness direction are individually formed, a plurality of conductive layers 16 individually formed partially on the substrate 12 and the insulating layers 15, and via conductors 17 individually connected to the conductive layers 16 filled in the via holes V.

Figure 2A:
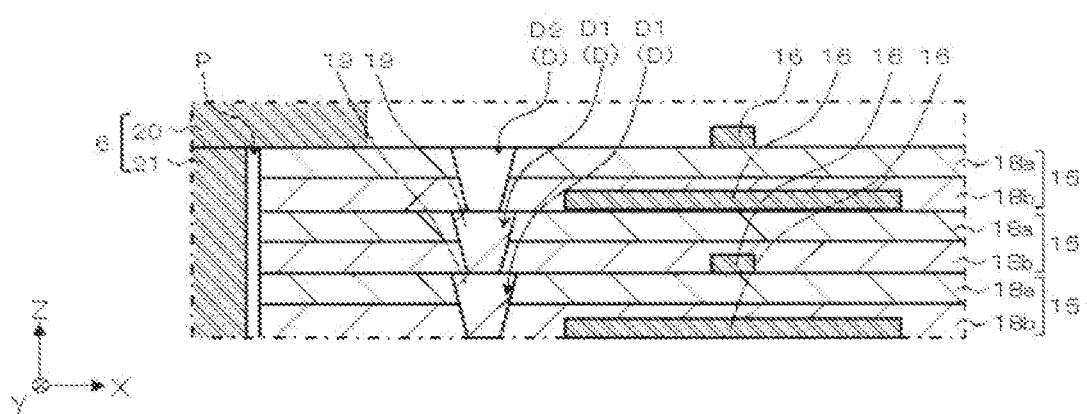
FIG. 2A is an enlarged cross sectional view of a portion R2 in FIG. 1B.

The insulating layer 15 not only serves as a support member for supporting the conductive layer 16 but also serves as an insulating member preventing the conductive layers 16 from establishing a short circuit therebetween. As illustrated in FIG. 2A, the insulating layer 15 is formed of a first resin layer 18a and a second resin layer 18b arranged closer to a side of the core substrate 10 than the first resin layer 18a is arranged. The thickness of the insulating layer 15 is set, for example, to 5 µm or larger and 40 µm or smaller.

The first resin layer 18a serves to increase stiffness of the insulating layer 15 and at the same time reduces a coefficient of thermal expansion in a planar direction thereof. The first resin layer 18a includes a resin and an inorganic insulation filler such as a silica filler formed of a plurality of particles dispersed in the resin. The coefficient of thermal expansion of the first resin layer 18a in a planar direction thereof is set, for example, to 0 ppm/° C. or larger and 30 ppm/° C. or smaller. The coefficient of thermal expansion of the first resin layer 18a in a thickness direction thereof is set, for example, to 20 ppm/° C. or larger and 50 ppm/° C. or smaller. Young's modulus of the first resin layer 18a is set, for example, to 2.5 GPa or larger and 10 GPa or smaller. Further, the first resin layer 18a has the Young's modulus which is larger than that of the second resin layer 18b and has a smaller coefficient of thermal expansion in a planar direction thereof.

For example, a thermoplastic resin such as polyimide resin is included as a resin forming the first resin layer 18a. In view of reducing the coefficient of thermal expansion in a planar direction, it is preferable that the resin be in a film form having a structure in which each of longer directions of molecular chains is parallel to the planar of the first resin layer 18a.

The second resin layer 18b serves to adhere, together, the first resin layers 18a that are adjacent to each other in a thickness direction thereof, and also to fix the conductive layer 16 by being adhered to side surfaces and one principal surface of the conductive layer 16. Although it is preferable that a resin forming the second resin layer 18b be free from an inorganic insulation filler in view of adhesion, it may include the inorganic insulation filler. The coefficient of thermal expansion of the second resin layer 18b in a planar direction and a thickness direction thereof is set, for example, to 10 ppm/° C. or larger and 100 ppm/° C. or smaller.

The coefficient of thermal expansion of the second resin layer 18a in a planar direction thereof is set, for example, equal to or larger than two times and equal to or smaller than 100 times the coefficient of thermal expansion of the first resin layer 18a in a planar direction. The Young's modulus of the second resin layer 18b is set, for example, to 0.05 GPa or larger and 0.5 GPa or smaller, and the Young's modulus of the second resin layer 18b is set, for example, equal to or larger than 0.0005 times and equal to or smaller than 0.2 times the Young's modulus of the first resin layer 18a. This means that the second resin layer 18b has the Young's modulus which is smaller than that of the first resin layer 18a.

For example, epoxy resin, bismaleimide triazine resin, cyanate resin, amide resin, or the like is included as a resin that forms the second resin layer 18b.

The conductive layer 16 functions as ground wiring, power supply wiring, or signal wiring. The conductive layer 16 is formed of a conductive material such as copper, titanium, molybdenum, chrome, or a nickel-chrome alloy. It is preferable that the conductive layer 16, in particular, include a base film made of a nickel-chrome alloy, and a conductor portion formed of copper provided on the base film. As a result, the adhesion strength between the conductive layer 16 and the first resin layer 18a is increased by means of the base film, and at the same time the conductivity of the conductive layer 16 can be increased by means of the conductor portion. Further, the thickness of the conductive layer 16 is set, for example, to 3 μm or larger and 20 μm or smaller.

The via conductor 17 is for connecting the conductive layers 16 together that are apart from each other in a thickness direction. The via conductor 17 is formed of a metallic material such as copper, titanium, molybdenum, chrome, or a nickel-chrome alloy.

The via conductor 17 is filled in the via hole V that penetrates through the insulating layer 15 in a thickness direction thereof. The via hole V has a tapered shape with a width becoming smaller toward the core substrate 10. The maximum diameter of the via hole V is set, for example, to 20 μm or larger and 50 μm or smaller. The minimum diameter of the via hole V is set, for example, to 10 μm or larger and 40 μm or smaller.

In addition, the dummy via hole D that penetrates through the insulating layer 15 in a thickness direction thereof is formed. In this embodiment, the dummy via hole D is formed between the through hole P and the conductive layer 16. Further, the dummy via hole D is formed only in the first buildup portion 11a between the pair of buildup portions 11. The dummy via hole D has a tapered shape with a width becoming smaller toward the core substrate 10. The maximum diameter of the dummy via hole D is set, for example, to 20 μm or larger and 50 μm or smaller. The minimum diameter of the dummy via hole D is set, for example, to 10 μm or larger and 40 μm or smaller. It is preferable that the maximum diameter of the dummy via hole D be identical with the maximum diameter of the via hole V. In this case, the maximum diameter of the dummy via hole D is set, for example, equal to or larger than 0.9 times and equal to or smaller than 1.1 times the maximum diameter of the via hole V.

For convenience sake, the dummy via hole D formed in the insulating layer 15 located inside the wiring board 3 is named as a first dummy via hole D1, and the dummy via hole D formed in the insulating layer 15 located at the outermost layer of the wiring board 3 is named as a second dummy via hole D2.

The first dummy via hole D1 is filled with a part (resin portion 19) of the second resin layer 18b of the insulating layer 15 that is adjacent to the insulating layer 15 having the first dummy via hole D1 formed therein. The dummy via hole D2 has no materials arranged therein, has space with an exposed inner surface, and is exposed to ambient atmosphere of the wiring board 3.

A through hole P penetrating through the wiring board 3 in a thickness direction thereof is formed in the wiring board 3 in a region where the conductive layers 16 are not formed. A part of a screw 6 is inserted into the through hole P. It is preferable that the through hole P have no screw threads and thread grooves formed therein, have a curved inner surface, and be away from the screw 6. As a result, it is possible to reduce an application of stress caused by the screw 6 to the inner surface of the through hole P, and reduce the occurrence of wire breakage of the conductive layer 16 caused by the stress. The diameter of the through hole P is set, for example, to 300 μm or larger and 3400 μm or smaller.

In addition, the main board 4 has a function of transmitting a signal from a measuring instrument to the wiring board 3. For example, a printed circuit board or the like can be used as the main board 4. Further, the main board 4 includes a screw hole H having screw threads and thread grooves formed in an inner surface thereof.

The reinforcing plate 5 has a function of reinforcing the main board 4 and thereby reducing warpage of the main board 4. The reinforcing plate 5 is formed of a metallic material such as stainless steel or aluminum.

The screw 6 has a function of fixing the wiring board 3 to the main board 4. Specifically, it works as described below. First, the screw 6 is formed of a screw head 20 and a threaded shaft 21. The screw head 20 makes contact with one principal surface of the wiring board 3, the threaded shaft 21 is inserted into the through hole P of the wiring board 3 and the screw hole H of the main board 4, and has screw threads and thread grooves on an outer surface thereof. The screw 6 can be screwed into the main board 4 by using the threaded shaft 21 as a male screw and the screw hole H of the main board 4 as a female screw. Then, by screwing the screw 6 into the main board 4, the screw head 20 is brought into contact with the wiring board 3, and by pressing the wiring board 3 by the screw head 20, the wiring board 3 is fixed to the main board 4. The first resin layer 18a of the insulating layer 15 forming the outermost layer of the first buildup portion 11a between the pair of buildup portions 11 is disposed on one principal surface of the wiring board with which the screw head 20 makes contact.

Incidentally, in the wiring board 3 as described above, since the screw head 20 makes contact with one principal surface of the wiring board 3, the wiring board 3 is entangled with the screw head 20 when the screw 6 is screwed in, and stress in a direction of the entanglement (entangling stress) may be applied to the wiring board 3. This entangling stress tends to be transmitted through the first resin layer 18a. When the entangling stress is transmitted through the first resin layer 18a and reaches the conductive layer 16, wire breakage of the conductive layer 16 tends to be caused. Particularly, in the case where the conductive layer 16 is wiring for signal, the width of a line is formed narrower, and therefore this line tends to be broken. Incidentally, it is assumed that the reason why the first resin layer 18a tends to transmit the entangling stress is that the Young's modulus of the first resin layer 18a is larger than that of the second resin layer 18b.

In addition, in the wiring board 3 according to this embodiment, the dummy via hole D penetrating through the first resin layer 18a in a thickness direction thereof is formed in a region between the through hole P and the conductive layer 16. As a result, the transmission of the entangling stress in the first resin layer 18a can be alleviated in the dummy via hole D. Accordingly, the occurrence of the wire breakage of the conductive layer 16 is reduced, and eventually the wiring board 3 having excellent the electrical reliability can be provided.

The dummy via hole D is formed in the first buildup portion 11a between the buildup portions 11. As a result, in the first buildup portion 11a with which the screw head 20 makes contact, the transmission of the entangling stress in the first resin layer 18a can be alleviated by the dummy via hole D. In contrast, in the second buildup portion 11b, since the core substrate 10 is interposed between the second buildup portion 11b and the screw head 20, the entangling stress is hardly transmitted by the core substrate 10 having high stiffness. Accordingly, it is possible to increase the productivity of the wiring board 3 by not forming the dummy via hole D while the reliability of the conductive layer 16 is secured.

Among the dummy via holes D, the resin portion 19 is filled in the first dummy via hole D1 that is formed in the first resin layer 18a located inside the wiring board 3. As a result, the entangling stress is concentrated in the interface between the first dummy via hole D1 and the resin portion 19 so that the transmission of the entangling stress to the conductive layer 16 in the first resin layer 18a can be reduced. Furthermore, since the resin portion 19 reduces the space inside the wiring board 3, it is possible to reduce swelling inside the wiring board 3 which is caused by the moisture infiltrated in the space by being vaporized by heating, and eventually reduce wire breakage of the conductive layer 16 caused by the swelling.

The resin portion 19 is a part of the second resin layer 18b. The second resin layer 18b tends to be subjected to elastic deformation because it has the Young's modulus which is lower than that of the first resin layer 18a. For this reason, as the resin portion 19 arranged in the first dummy via hole D1 is subjected to the elastic deformation, it is possible to reduce the transmission of the entangling stress in the first resin layer 18a to the conductive layer 16.

Among the dummy via holes D, the second dummy via hole D2 formed in the first resin layer 18a located at the outermost layer of the wiring board 3 has space therein. The second dummy via hole D2 having the space therein can suppress the transmission of the entangling stress more strongly than the first dummy via hole D1 with a material filled therein. Accordingly, the wire breakage of the conductive layer 16 formed on the first resin layer 18a at the outermost layer can be effectively reduced by forming the second dummy via hole D2 in the first resin layer 18a at the outermost layer to which the entangling stress is most powerfully applied. Further, since the second dummy via hole D2 having space therein is formed in the first resin layer 18a at the outermost layer, and the inner surface of the second dummy via hole D2 is exposed to outside, the swelling of the wiring board 3 can be suppressed.

The dummy via holes D are formed in individual layers of the insulating layers 15 that form the first buildup portion 11a. As illustrated in FIG. 2A, these dummy via holes D are aligned in a single row in a stack direction of the insulating layers 15 (stack structure).

Figure 2B:
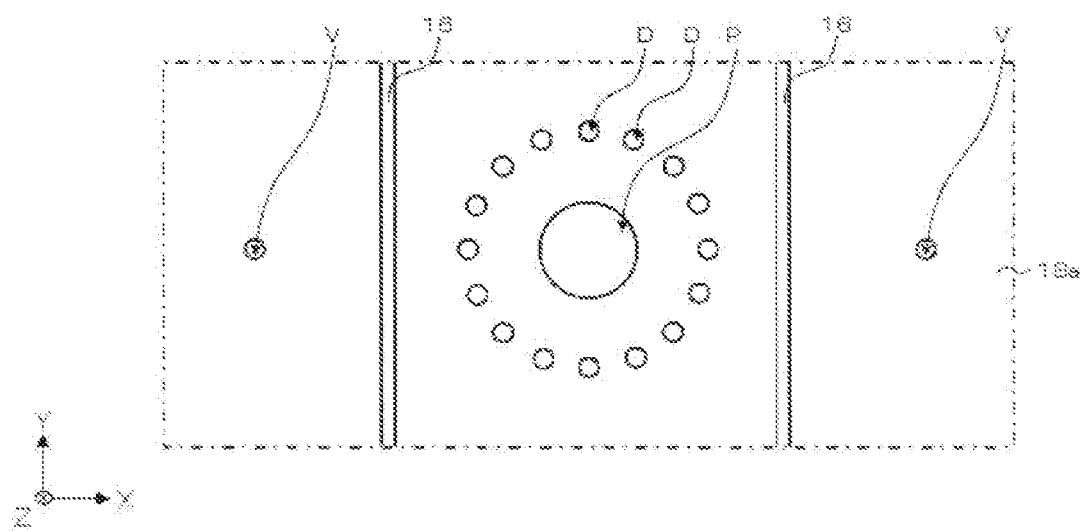
FIG. 2B is a plan view of a first resin layer of a first buildup portion in FIG. 1B.

A plurality of dummy via holes D are formed in a single layer of the insulating layer 15. As illustrated in FIG. 2B, the plurality of dummy via holes D are arranged in a manner to surround the through hole P in plan view. As a result, it is possible to reduce the occurrence of the wire breakage of the conductive layers 16 formed in the vicinity of the through hole P, which increases freedom of wiring design.

Accordingly, the foregoing probe card 1 can transmit a signal of the measuring instrument connected to the main board 4 to the semiconductor wafer which makes contact with the probe 7 of the probe head 2 by sequentially transmitting the signal to the main board 4, the wiring board 3, and the probe head 2. Additionally, the probe card 1 can transmit a signal of the semiconductor wafer to the measuring instrument by transmitting the signal in the reverse direction. As a result, the probe card 1 can make the inspection of the electrical reliability of the semiconductor wafer possible and thereby exerts its desired function.

Next, a method for manufacturing the foregoing probe card 1 will be described with reference to FIGS. 3 to 6. First, a method for preparing the wiring board 3 will be described in detail.

(Preparation of Wiring Board)

Figure 3A:
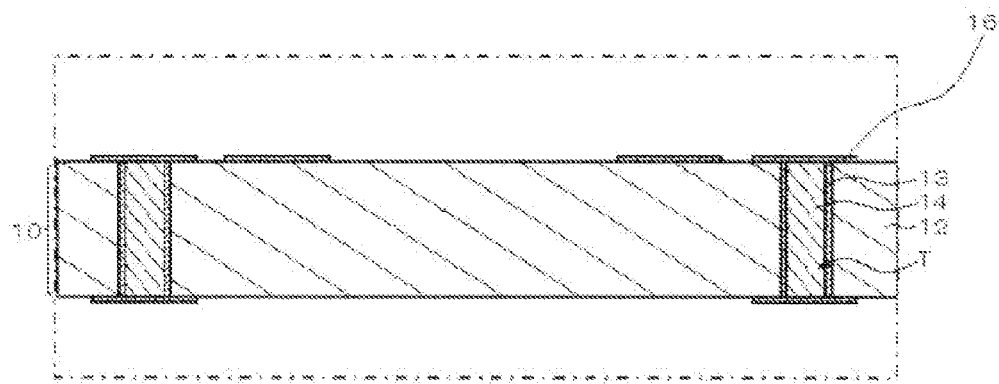
FIGS. 3A to 3C are cross sectional views taken along a thickness direction for explaining manufacturing processes of the probe card illustrated in FIG. 1A.

(1) As illustrated in FIG. 3A, the core substrate 10 having the conductive layers 16 formed on two principal surfaces thereof is prepared. Specifically, this is performed in the following way.

First, the substrate 12 is prepared by stacking a plurality of uncured resin sheets and stacking a copper foil on the outermost layer, and then curing the stacked body through heating and pressurizing. The uncured state is a state of A-stage and B-stage complying with ISO472:1999. Next, a through-hole penetrating through the substrate 12 in a thickness direction thereof is formed by drilling, laser processing, or the like. Then, a conductive material is adhered to the inner wall of the through hole through non-electroplating, electroplating, or the like to form the through hole conductor 13. Next, a resin material or the like is filled inside the through hole conductor 13 to form the insulator 14. Subsequently, after the conductive material is adhered to the exposed portion of the insulator 14, the copper foil is patterned through the conventionally well-known photolithography, etching, or the like to form the conductive layer 16.

Figure 3B:
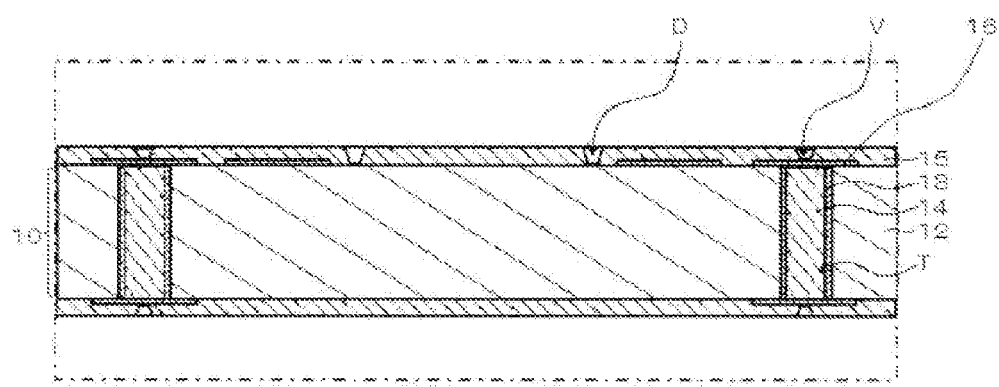

(2) As illustrated in FIG. 3B, the insulating layer 15 is formed on the core substrate 10, and the via hole V and the dummy via hole D are formed in the insulating layer 15. Specifically, this is performed in the following way.

First, after the film-like first resin layer 18a is arranged on the core substrate 10 through the uncured second resin layer 18b, the core substrate 10, the second resin layer 18b, and the first resin layer 18a are heated and pressurized to cure the second resin layer 18b, to thereby form the insulating layer 15 on the core substrate 10. Then, the via hole V is formed in the insulating layer 15 by, laser processing such as the YAG laser device or the carbon dioxide gas laser device so that at least a part of the conductive layer 16 is exposed in the via hole V. Additionally, the dummy via hole D is formed in a manner similar to the manner used for the via hole V.

In this way, by forming the dummy via hole D by the laser processing, the dummy via hole D can be formed in a tapered shape with a width becoming smaller toward the core substrate 10.

Figure 3C:
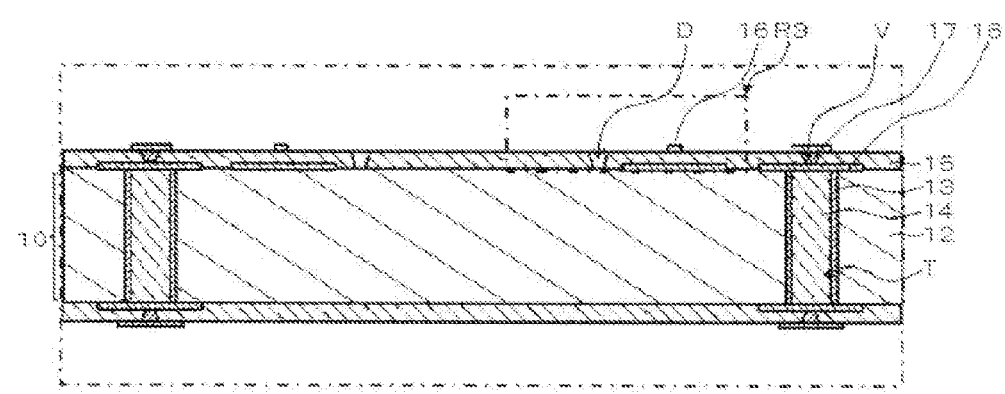
Figure 4A:
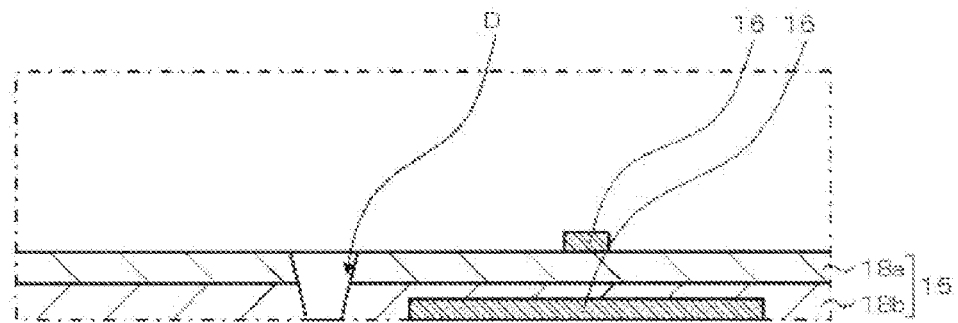
FIG. 4A is an enlarged cross sectional view of a portion R3 in FIG. 3C.
Figure 4B:
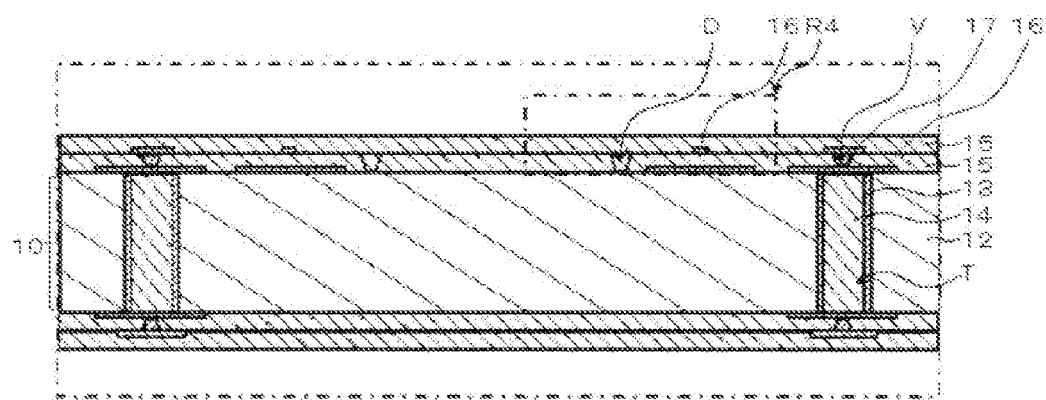
FIG. 4B is a cross sectional view taken along a thickness direction for explaining a manufacturing process of the probe card illustrated in FIG. 1A.

(3) As illustrated in FIG. 3C and FIG. 4A, the conductive layer 16 is formed on the insulating layer 15, and the via conductor 17 is formed in the via hole V. Specifically, this is performed in the following way.

First, a base film is formed on the insulating layer 15 and on the inner surface of the via hole V using the sputtering method. Next, a patterned resist is formed on the base film using the photolithography. Then, the conductor portion is partially formed on the base film using the electroplating method. Next, the resist is removed from the base film. Subsequently, a non-forming region of the conductor portion on the base film is removed by etching so that the conductive layer 16 and the via conductor 17 are formed.

By forming the resist on the dummy via hole D, it is possible to maintain space inside the dummy via hole D without forming the via conductor 17 in the dummy via hole D.

Figure 6A:
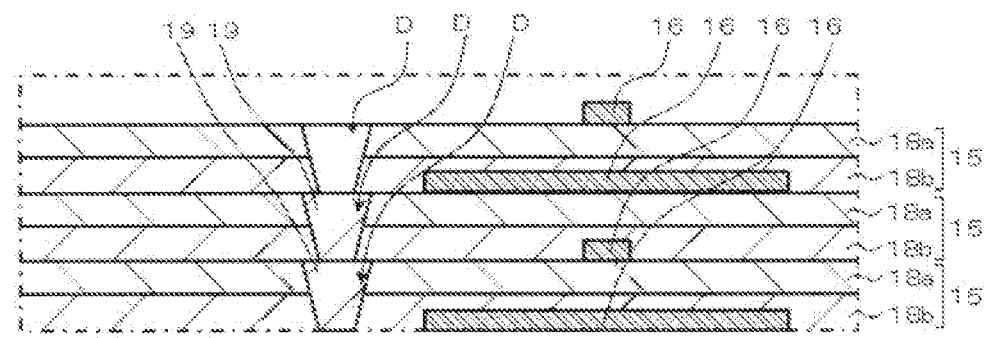
FIG. 6A is an enlarged cross sectional view of a portion R6 in FIG. 5C.
Figure 6B:
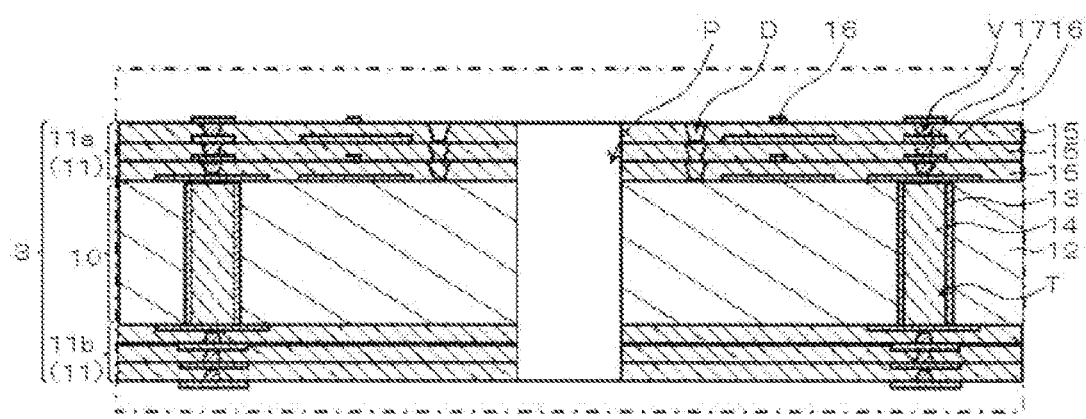
FIG. 6B is a cross sectional view taken along a thickness direction for explaining a manufacturing process of a mounting structure illustrated in FIG. 1.

(4) As illustrated in FIGS. 4B to 6A, after forming the pair of buildup portions 11 by repeating the steps described in the foregoing (2) and (3), as illustrated in FIG. 6B, the through hole P is formed by drilling so that the wiring board 3 is prepared.

Figure 4C:
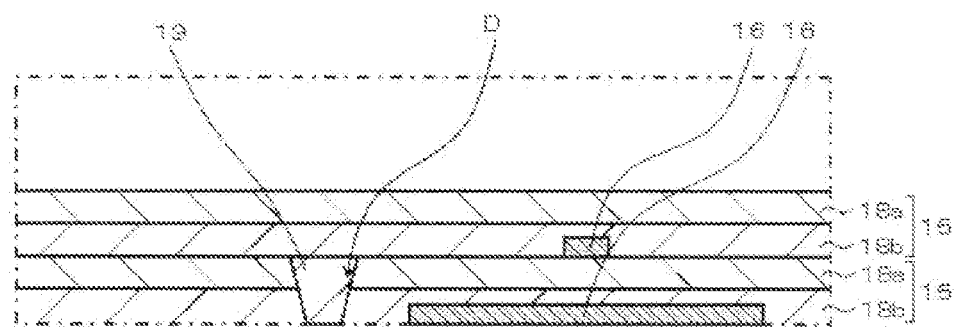
FIG. 4C is an enlarged cross sectional view of a portion R4 in FIG. 4B.
Figure 5A:
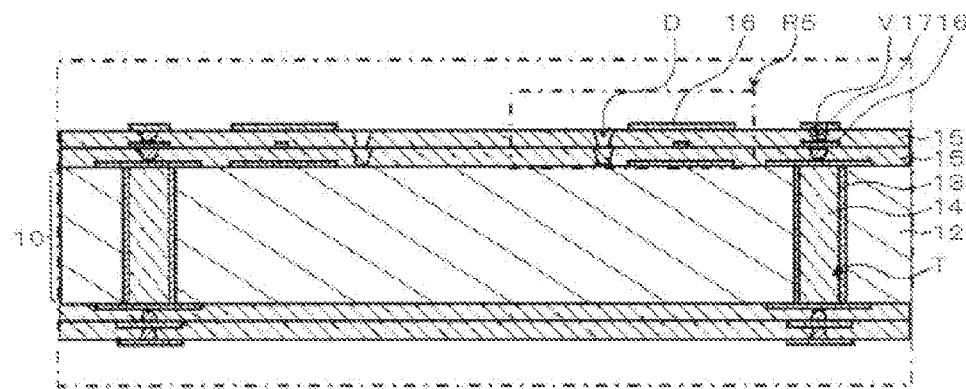
FIG. 5A is a cross sectional view taken along a thickness direction for explaining a manufacturing process of the probe card illustrated in FIG. 1A.
Figure 5B:
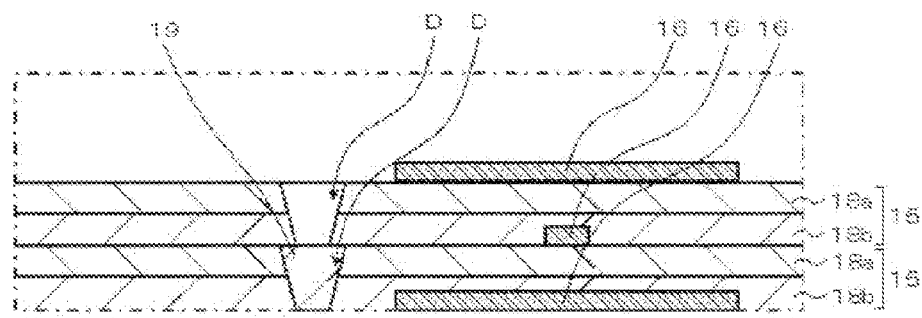
FIG. 5B is an enlarged cross sectional view of a portion R5 in FIG. 5A.
Figure 5C:
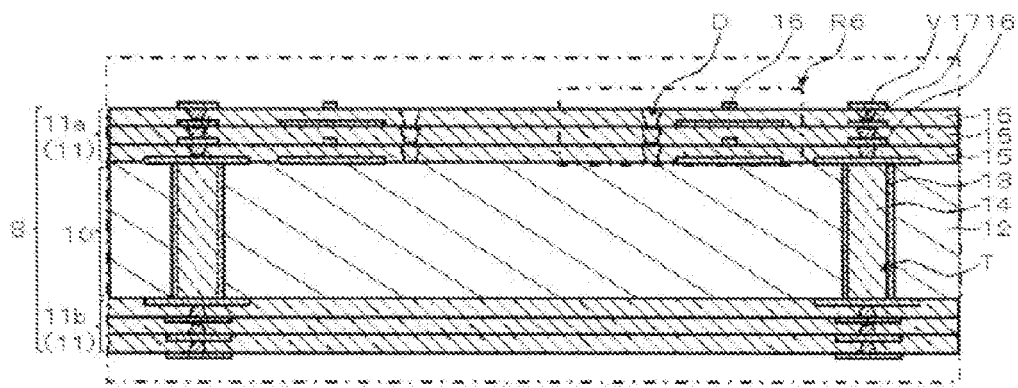
FIG. 5C is a cross sectional view taken along a thickness direction for explaining a manufacturing process of the probe card illustrated in FIG. 1A.

In step (3), after the dummy via hole D is formed in the insulating layer 15, and the conductive layer 16 is formed, as illustrated in FIG. 4C, the film-like first resin layer 18a is arranged on the insulating layer 15 through the second resin layer 18b which is uncured, in a similar manner as applied in step (2). Thereafter, when the second resin layer 18b and the first resin layer 18a are heated and pressurized to cure the second resin layer 18b, the resin portion 19 is formed when a part of the second resin layer 18b gets into the dummy via hole D.

During such a process, since the dummy via hole D has a tapered shape with a width becoming smaller toward the core substrate 10, the part of the second resin layer 18b is easily filled in the dummy via hole D.

The wiring board 3 can be prepared in this way. Next, a method for preparing the probe card 1 using the wiring board 3 will be described.

(Preparation of Probe Card)

(5) The probe card illustrated in FIG. 1 can be prepared by sequentially connecting the probe head 2, the wiring board 3, the main board 4, and the reinforcing plate 5.

As to the wiring board 3 and the main board 4, after the screw shaft 21 of the screw 6 is inserted into the through hole P of the wiring board 3, a tip end portion of the screw shaft 21 is further inserted into the screw hole H of the main board 4. Then, the screw 6 is screwed into the screw hole H, and the wiring board 3 is pressed by the screw head 20 so that the wiring board 3 is fixed to the main board 4.

The present invention is not limited to the embodiment described above, and various modifications, improvements, combinations, and the like may be made without departing from the spirits and scope of the present invention.

For example, in the above embodiment, the description has been given of an example of a structure in which the wiring board is used in the probe card. However, the wiring board may be fixed to the other member by a screw, or may be used for other applications.

In the above embodiment, the description has been given of an example of a structure in which the buildup portions are formed using the insulating layers of three layers. However, the insulating layer may be formed of at least one layer.

In the above embodiment, the description has been given of an example of a structure in which the first dummy via hole filled with the resin portion and the second dummy via hole having space therein. However, only one of them may be formed.

In the above embodiment, apart of the second resin layer is used as the resin portion. However, a resin which is different from the second resin layer may be used as the resin portion.

Such a resin portion can be formed by filling a resin which is different from the second resin layer after the first dummy via hole is formed in the foregoing step (2).

Figure 7A:
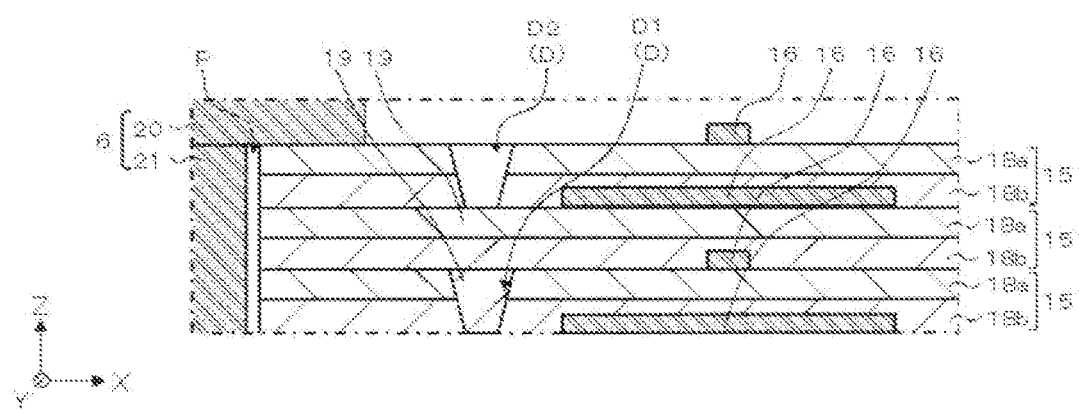
FIG. 7A is a cross sectional view of a portion corresponding to the portion illustrated in FIG. 2A of a probe card according to another embodiment of the present invention.
Figure 7B:
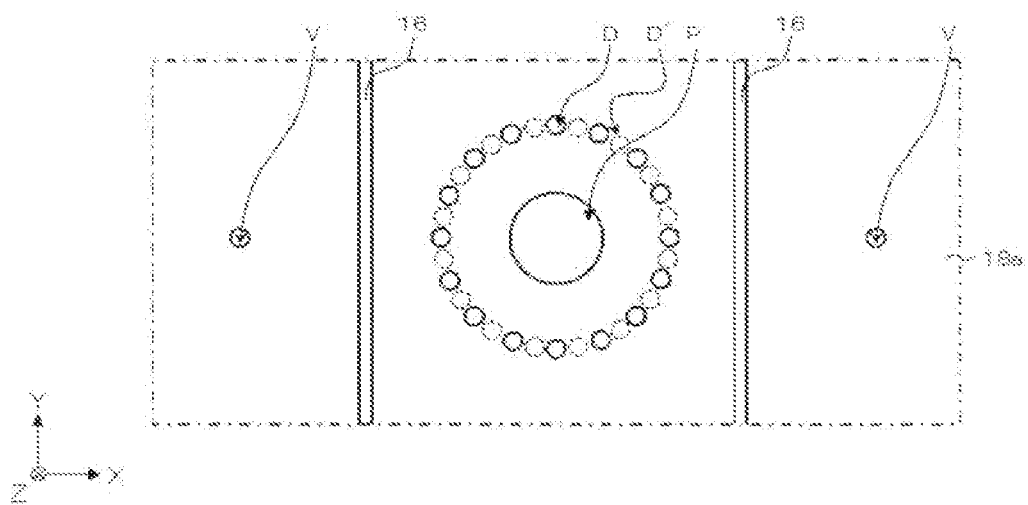
FIG. 7B is a plan view of a portion corresponding to the portion illustrated in FIG. 2B of the probe card illustrated in FIG. 7A.

In the above embodiment, the description has been given of an example of a structure in which the dummy via holes are arranged as a stack structure. However, the dummy via hole may be formed only in the insulating layer having a single layer, or, as illustrated in FIG. 7, they may be arranged as a spiral structure in which positions in planer direction are deviated from one another in the individual layers. In such a case, the dummy via holes are further distributed in the vicinity of the through hole P as compared with the stack structure. Accordingly, the transmission of the entangling stress in the vicinity of the through hole P can be uniformly reduced, and thereby the occurrence of the wire breakage of the conductive layer 16 can be reduced.

In the case where the dummy via holes are arranged in the spiral structure, as illustrated in FIG. 7, in a set of adjacent insulating layers 15, it is preferable that the dummy via hole D' of one of the insulating layers 15 be arranged between the dummy via holes D in the other of the insulating layers 15. Also, it is preferable that an end portion of the dummy via hole D on a side of the core substrate 10 be formed of a recess of the first resin layer 18a arranged closer to a side of the core substrate 10 than the dummy via hole D, and a part of the resin portion 19 be filled in the recess. The recess can be formed by arbitrarily adjusting the laser condition when the dummy via hole is formed. This recess may be applied to the embodiment in which the dummy via holes are arranged in the stack structure as described above.

Figure 8:
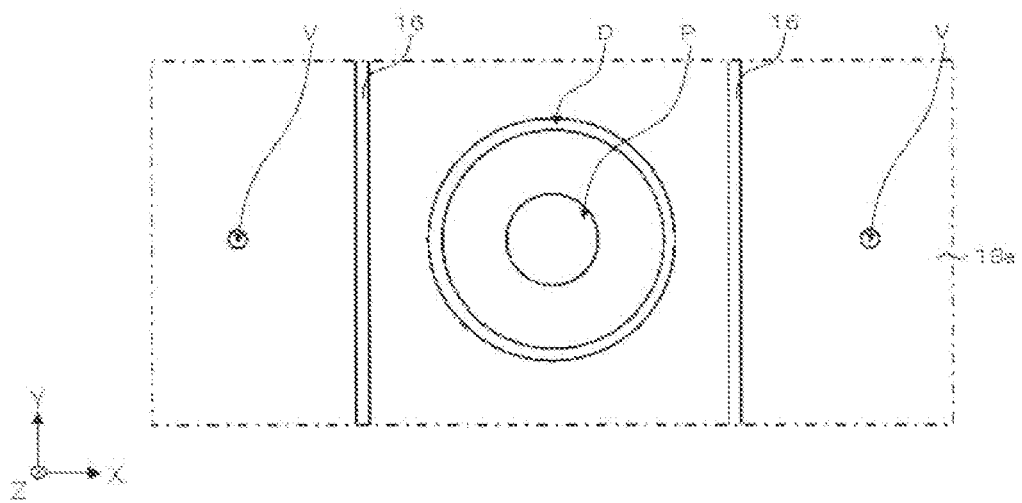
FIG. 8 is a plan view of a portion corresponding to the portion illustrated in FIG. 2B of a probe card according to yet another embodiment of the present invention.

In the above embodiment, the description has been given of an example of a structure in which the plurality of dummy via holes are arranged in a manner to surround the through hole. However, the plurality of dummy via holes are not necessarily arranged as described above, but may be arranged so that at least one dummy via hole is arranged between the through hole and the conductive layer. Further, as another example of the dummy via holes D, the dummy via holes D are formed, preferably, in an annular pattern surrounding the through hole P, and, more preferably, in a toric pattern, as illustrated in FIG. 8. In such a case, the transmission of the stress in the first resin layer 18a can be more effectively reduced. Such dummy via holes D can be formed by deviating the positions of emitting laser beams so that the positions partially overlap one another in the foregoing step (2).

What is claimed is:

1. A wiring board comprising:
   a first resin layer formed of a thermoplastic resin;
   a conductive layer formed partially on the first resin layer;
   a through hole for insertion of a screw formed in a region where the conductive layer is not formed and penetrating through the first resin layer in a thickness direction thereof; and
   a dummy via hole for alleviating a transmission of an entangling stress formed in a region between the through hole and the conductive layer and penetrating through the first resin layer.

2. The wiring board according to claim 1, further comprising a resin portion filled in the dummy via hole.

3. The wiring board according to claim 1,
   wherein, as the dummy via hole, there are provided a plurality of dummy via holes, and
   the plurality of dummy via holes are arranged to surround the through hole.

4. The wiring board according to claim 1,
   wherein the dummy via hole is formed in an annular pattern surrounding the through hole.

5. A wiring board comprising:
a core substrate; and
a buildup portion formed on one principal surface of the core substrate,
wherein the buildup portion comprises:
- an insulating layer having a first resin layer formed of a thermoplastic resin;
- a conductive layer formed partially on the first resin layer;
- a through hole for insertion of a screw formed in a region where the conductive layer is not formed and penetrating through the first resin layer in a thickness direction thereof; and
- a dummy via hole for alleviating a transmission of an entangling stress formed in a region between the through hole and the conductive layer and penetrating through the first resin layer.

6. The wiring board according to claim 5, wherein a plurality of the insulating layers and a plurality of the conductive layers are stacked on the one principal surface of the core substrate.

7. The wiring board according to claim 5, wherein other buildup portion is stacked on other principal surface of the core substrate, and
wherein the other buildup portion includes:
- an insulating layer having a first resin layer formed of a thermoplastic resin;
- a conductive layer formed partially on the first resin layer; and
- a through hole for insertion of a screw formed in a region where the conductive layer is not formed and penetrating through the first resin layer in a thickness direction thereof.

8. The wiring board according to claim 7, wherein each of the buildup portion and the other buildup portion includes a via hole penetrating therethrough in a thickness direction thereof, and the via hole is filled with a via conductor to be connected to the conductive layer formed in the buildup portion, and to be connected to the conductive layer formed in the other buildup portion, and
wherein the core substrate includes:
- a substrate having a through hole formed therein and penetrating through the core substrate in a thickness direction thereof; and
- a through hole conductor formed on an inner wall of the through hole and electrically connecting the via conductor formed in the buildup portion to the via conductor formed in the other buildup portion.

9. A probe card comprising:
the wiring board according to claim 1;
a probe head connected to one principal surface of the wiring board and including a probe;
a main board connected to other principal surface of the wiring board and including a screw hole formed therein; and
a screw connecting the wiring board and the main board to each other, and
wherein a screw head of the screw makes contact with the one principal surface of the wiring board, and
a threaded shaft of the screw is inserted into both the through hole and the screw hole.

10. A probe card comprising:
the wiring board according to claim 5;
a probe head connected to one principal surface of the wiring board and including a probe;
a main board connected to other principal surface of the wiring board and including a screw hole formed therein; and
a screw connecting the wiring board and the main board to each other, and
wherein a screw head of the screw makes contact with the one principal surface of the wiring board, and
a threaded shaft of the screw is inserted into both the through hole and the screw hole.

* * * * *